(12) United States Patent
Frank et al.

(10) Patent No.: US 10,755,759 B2
(45) Date of Patent: Aug. 25, 2020

(54) SYMMETRICALLY PROGRAMMABLE RESISTIVE SYNAPSE FOR RPU USING CURRENT-PROGRAMMED SINGLE DOMAIN WALL FERROELECTRIC

(71) Applicant: International Business Machines Corporation, Armonk, NY (US)

(72) Inventors: Martin M. Frank, Dobbs Ferry, NY (US); Jin-Ping Han, Yorktown Heights, NY (US); Dennis M. Newns, Yorktown Heights, NY (US); Paul M. Solomon, Westchester, NY (US); Xiao Sun, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 78 days.

(21) Appl. No.: 16/021,575

(22) Filed: Jun. 28, 2018

(65) Prior Publication Data

US 2020/0005848 A1    Jan. 2, 2020

(51) Int. Cl.
| | | |
|---|---|---|
| *G11C 11/22* | (2006.01) | |
| *G11C 11/54* | (2006.01) | |
| *G06N 3/063* | (2006.01) | |
| *G06F 3/06* | (2006.01) | |

(52) U.S. Cl.
CPC .......... *G11C 11/221* (2013.01); *G06F 3/0604* (2013.01); *G06F 3/0646* (2013.01); *G06F 3/0673* (2013.01); *G06N 3/063* (2013.01); *G11C 11/2257* (2013.01); *G11C 11/2273* (2013.01); *G11C 11/2275* (2013.01); *G11C 11/54* (2013.01)

(58) Field of Classification Search
CPC .............. G11C 11/221; G11C 11/2275; G11C 11/2273; G11C 11/54; G11C 11/2257; G06F 3/0604; G06F 3/0673; G06F 3/0646; G06N 3/063
See application file for complete search history.

(56) References Cited

U.S. PATENT DOCUMENTS

| | | | |
|---|---|---|---|
| 5,587,943 A | 12/1996 | Torok et al. | |
| 5,764,178 A * | 6/1998 | Kim .......................... | G11C 7/22 341/173 |
| 6,127,878 A * | 10/2000 | Hanson ................ | G11C 7/1012 327/112 |
| 7,667,994 B1 | 2/2010 | Moriya et al. | |

(Continued)

OTHER PUBLICATIONS

Gokmen et al.; "Acceleration of Deep Neural Network Training with Resistive Cross-Point Devices: Design Considerations"; Frontiers in Neuroscience, vol. 10, Article 333; Jul. 2016; 13 pages.

(Continued)

*Primary Examiner* — Sultana Begum
(74) *Attorney, Agent, or Firm* — Cantor Colburn LLP; Vazken Alexanian

(57) ABSTRACT

A circuit is provided. The circuit includes a ferroelectric tunneling junction ("FTJ") coupled in series with a YR read line. The circuit also includes a pull-up circuit having a write line YW as a first input with an output in series with the FTJ, and a pull-down circuit having the write line YW as a first input with an output in series with the second side of the FTJ.

11 Claims, 7 Drawing Sheets

(56) References Cited

U.S. PATENT DOCUMENTS

| | | | |
|---|---|---|---|
| 8,159,865 | B2 | 4/2012 | Ohmori et al. |
| 8,238,135 | B2 | 8/2012 | Suzuki et al. |
| 8,638,601 | B1 | 1/2014 | Parkin et al. |
| 9,368,208 | B1 * | 6/2016 | Marshall ............ G11C 14/0081 |
| 9,934,838 | B1 | 4/2018 | Han et al. |
| 2010/0097847 | A1 | 4/2010 | Ohmori |
| 2012/0199470 | A1 | 8/2012 | Mori et al. |
| 2017/0154675 | A1 * | 6/2017 | Kang ................... G11C 13/004 |
| 2017/0337983 | A1 | 11/2017 | Wang et al. |
| 2018/0151223 | A1 * | 5/2018 | Torti .................. G11C 13/0069 |

OTHER PUBLICATIONS

Lee et al.; "Multilevel Data Storage Memory Using Deterministic Polarization Control"; Advanced Materials (2012); 5 pages.

McGilly et al.; "Controlling domain wall motion in ferroelectric thin films"; Nature Nanotechnology—Supplementary Information (2015); 18 pages.

McGilly et al.; "Velocity Control of 180° Domain Walls in Ferroelectric Thin Films by Electrode Modification"; ACS Pulications—Nano Letters (2016); 6 pages.

Yang et al.; "Domain wall motion in epitaxial Pb(Zr,Ti)O3 capacitors investigated by modified piezoresponse force microscopy"; AIP Applied Physics Letters, vol. 92, Issue 25 (2008); 15 pages.

* cited by examiner

SYMMETRICALLY PROGRAMMABLE RESISTIVE SYNAPSE FOR RPU USING CURRENT-PROGRAMMED SINGLE DOMAIN WALL FERROELECTRIC

BACKGROUND

The present invention relates in general to non-linear elements, and more specifically, to symmetrically programmable resistive synapse for a resistive processing unit ("RPU") using current-programmed single domain wall ferroelectrics.

Ferroelectric materials are characterized by a finite electric polarization in the absence of an external electric field. This polarization must possess at least two stable states, and must have the ability to be reversibly switched from one state to another by the application of an electric field. Thus, regions with different orientations of the polarization vector can coexist within a ferroelectric sample, and these regions are called ferroelectric domains. Ferroelectric domain walls are close to atomically sharp topological defects that separate regions of uniform polarization. The discovery of electrical conductivity in specific types of walls gave rise to "domain wall nanoelectronics," a technology in which the wall (rather than the domain) stores information.

SUMMARY

One or more embodiments of the invention provide a circuit. The circuit includes a ferroelectric tunneling junction ("FTJ") coupled in series with a YR read line. The circuit also includes a pull-up circuit having a write line YW as a first input with an output in series with the FTJ, and a pull-down circuit having the write line YW as a first input with an output in series with the second side of the FTJ.

One or more embodiments of the invention provide a method of operating an FTJ. The method includes receiving a command and determining whether the command is a write up command, a write down command, or a read command. When the command is a write up command, and YN=0, charge is removed from the FTJ with a substantially constant current removed over a period of time, and when the command is a write down command, and YN=1, charge is added to the FTJ with a substantially constant current added over a period of time.

One or more embodiments of the invention provide a circuit. The circuit includes a YW line and a first analog inverter with its input coupled to the YW line. The circuit also includes a second analog inverter with its input coupled to the YW line. The circuit includes a PFET with its gate coupled to the output of the first inverter and its source coupled to $V_{DD}$, and an NFET with its gate coupled to the output of the second inverter and its source coupled to ground. The circuit has an FTJ with a first side coupled to the drain of the PFET and the drain of the NFET and a second side coupled to a YR line, and a second NFET with its gate coupled to an RE line, its drain coupled to the first side of the FTJ, and its source coupled to an XR line.

DETAILED DESCRIPTION

Figure 1:
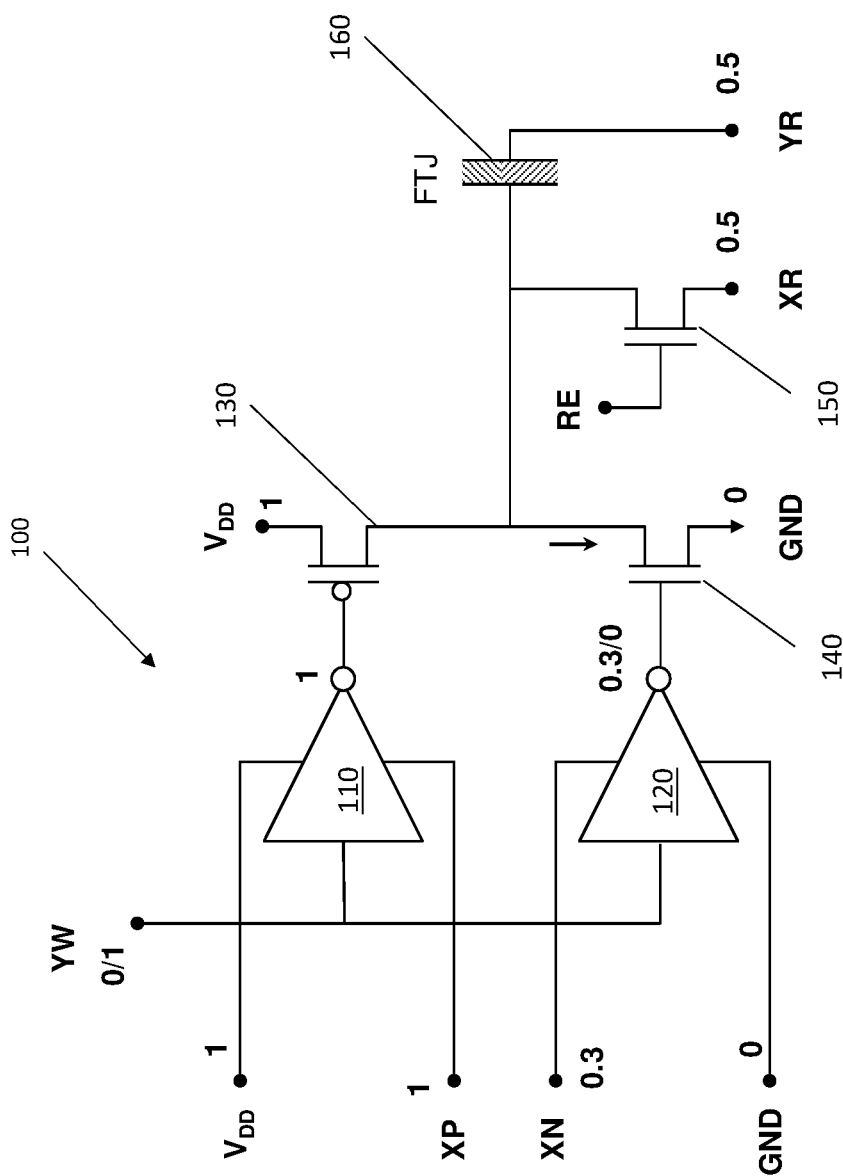
FIG. 1 illustrates a circuit 100, capable of write up, write down and read operations on a ferroelectric tunneling junction ("FTJ"), configured and arranged to implement a write up operation in an exemplary embodiment consistent with the principles of the present invention.

Various embodiments of the present invention are described herein with reference to the related drawings. Alternative embodiments of the invention can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments of the invention whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

As deep neural networks implemented in software programs are coming into greater use, there is extensive interest in exploring the possibility of implementation in hardware. The motivation is that a hardware deep neural network ("DNN"), which stores information in a set of synapse or RPU arrays of rewritable analogue memories, can address all the elements in the matrix simultaneously in read or write mode. Hence a very great speedup can be achieved in this unique degree of parallelization. Various hardware implementations of the RPU device are being considered, among which are ferroelectric synapse devices. The form of ferroelectric device discussed here uses a strip of ferroelectric ("FE") material with a single domain wall transverse to the strip axis. Electrodes are formed on the top and bottom surfaces of the FE strip. Application of a voltage across the FE causes the domain wall ("DW") to move along the strip axis. An opposite voltage will reverse the motion. The domain wall location in the strip acts as an analogue memory that can be written symmetrically using positive or negative voltages. The voltage driven pinning at the two ends is applied to convert multi-domain walls into a single domain wall and then control the boundary conditions in writing to the single domain wall configuration.

There are many problems with existing techniques for providing DW control. For example, if there is a sharp voltage threshold for achieving significant DW velocity, as is generally the case in practical samples, it will be hard to accurately control the velocity of DW motion, and hence the DW displacement, thereby leading to a write errors. In addition, propagation of the DW under voltage alone can be irregular due to pinning centers (impurities that stop smooth movement), geometrical irregularities, or other imperfections interrupting the uniform motion. Proposed device and operation design requirements for previously proposed pinning approaches can be stringent. A Hebbian update of DW motion involves nanosecond timescale pulse sequences, which are relatively complex to generate, involving high costs in terms of neuron circuit complexity, transistor count, and area.

Embodiments of the invention address one or more of the above-described deficiencies by providing a current-driven, single domain wall propagation process instead of a voltage driven process. Control by fixed current should stabilize the DW motion by one or more of: replacing threshold-type dependence on voltage by dependence on a fixed current; and reducing dependence on factors such as pinning centers and geometrical irregularities. This leads to more predictable and reliable performance of the device. The Hebbian update of the DW motion here involves a constant current $I_x$ controlled by the write up/write down voltage inputs $V_{XP}$/$V_{XN}$, respectively, (in each case a long pulse lasting the full length of the write sequence) and a voltage of fixed amplitude but in a pulse of controlled length in time $t_y$, determining the ON/OFF phases of the constant current. The product $I_x t_y$ controls the amplitude of the Hebbian update. Read operations are based on the concept of the Ferroelectric tunneling junction, which is directly related to polarization of the FE film.

FIG. 1 illustrates a circuit 100, capable of write up, write down and read operations on a ferroelectric tunneling junction configured and arranged to implement a write up operation in an exemplary embodiment consistent with the principles of the present invention. A first analog inverter 110 is coupled between YW and the gate of PFET 130. A second analog inverter 120 is coupled between YW and the gate of NFET 140. In the following, $V_{DD}=1$ for simplicity. GND is at 0. A memory controller (not shown) controls signals on YW, XP, XN, XR, YR and RE. $V_{XR}=V_{YR}=0.5$. $V_{RE}=0$. During the write up operation, also known as a pull down phase, the voltage on line XP, $V_{XP}=1$, and the line XN carries a voltage $V_{XN}$ between 0 and 0.5 which controls the magnitude of the write current $I_x$ (XN is shown as $V_{XN}=0.3$ as an example). Under these conditions PFET 130 is OFF. The NFET 140 has a source-drain current $I_x$ approximately given by its transconductance $\gamma_N$ times the gate-source voltage $V_{XN}$, $I_x \sim \gamma_N V_{XN}$. NFET 140 acts as a pull down circuit, acting as long as $V_{YW}=0$ for time $t_y$, which lowers the charge on the left electrode of the FTJ. When $V_{YW}=1$ both PFET 130 and NFET 140 are OFF and no write action occurs. The change in charge on the FTJ is thus given by $I_x t_y \sim \gamma_N V_{XN} t_y$. As will be explained in more detail with respect to FIG. 4, the overall movement of the DW depends on the product of the voltage on the XN line and the length of the pulse on the YW line.

Figure 2:
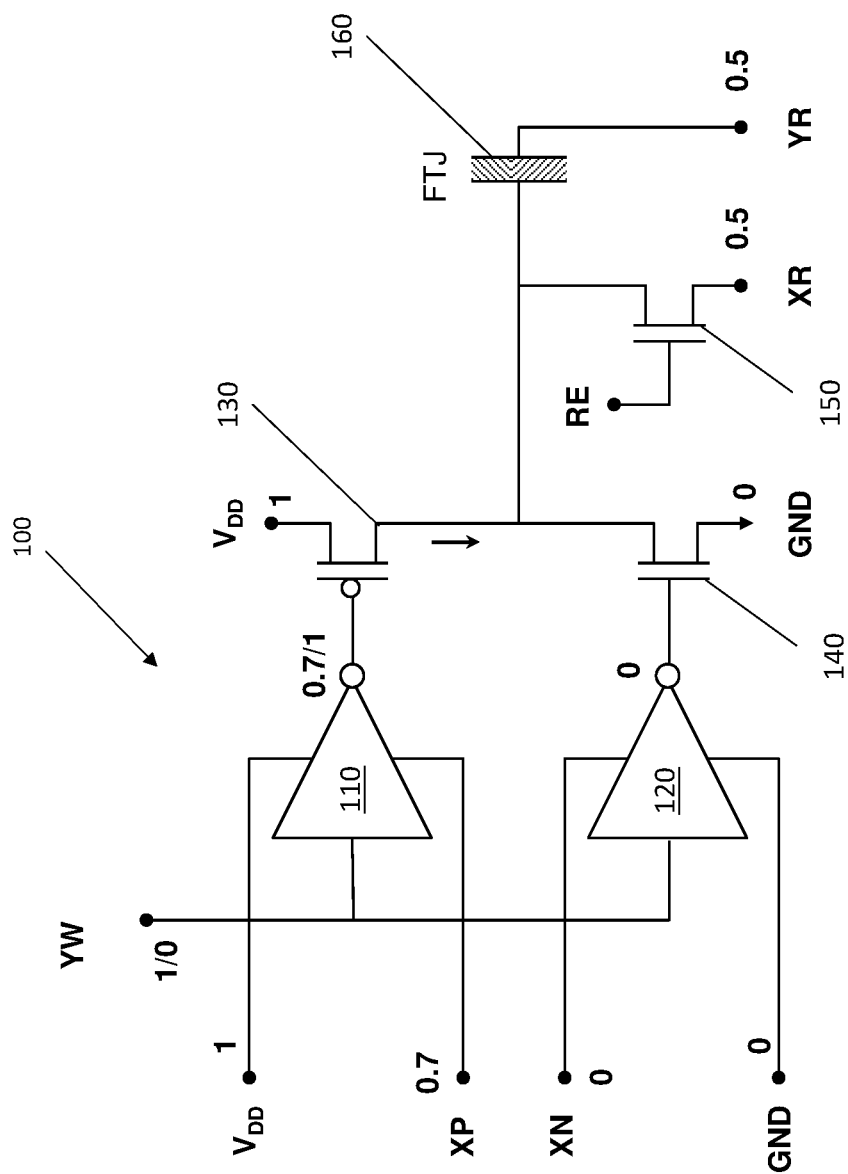
FIG. 2 illustrates a circuit 100 configured and arranged to implement a write down operation on a ferroelectric tunneling junction in an exemplary embodiment consistent with the principles of the present invention.

FIG. 2 illustrates a circuit 100 configured and arranged to implement a write down operation on a ferroelectric tunneling junction in an exemplary embodiment consistent with the principles of the present invention. In the following, take $V_{DD}=1$ for simplicity. GND is at 0. A memory controller (not shown) controls signals YW, XP, XN, XR, YR and RE. $V_{XR}=V_{YR}=0.5$. $V_{RE}=0$. During the write down operation, also known as a pull up phase, the voltage on line XN, $V_{XN}=0$, and the line XP carries a voltage $V_{XP}$ between 0.5 and 1 which controls the magnitude of the write current $I_x$ (XP is shown as XN=0.7 as example). Under these conditions NFET 140 is OFF. PFET 130 has a source-drain current $I_x$ approximately given by its transconductance $\gamma_P$ times the gate-source voltage $(1-V_{XP})$. PFET 130 acts as a pull up circuit, acting as long as $V_{YW}=1$ for time $t_y$, which raises the charge on the left electrode of the FTJ. When $V_{YW}=0$ both PFET 130 and NFET 140 are OFF and no write action occurs. The change in charge on the FTJ is thus given by $I_x t_y \sim \gamma_P (1-V_{XP}) t_y$. As will be explained in more detail with respect to FIG. 4, the overall movement of the DW depends on the product of the voltage on the XP line and the length of the pulse on the YW line.

Figure 3:
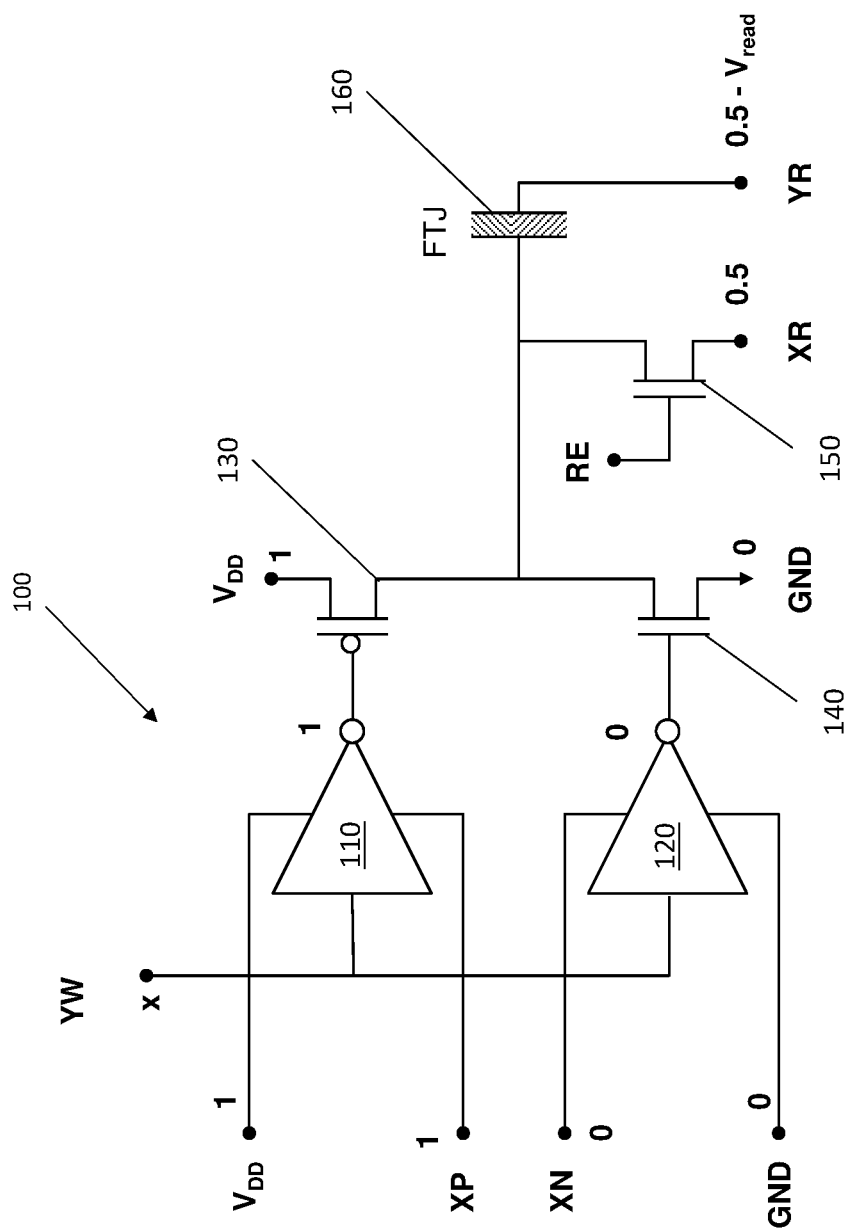
FIG. 3 illustrates a circuit for implementing read and write operations on a ferroelectric tunneling junction during a read operation in an exemplary embodiment consistent with the principles of the present invention.

FIG. 3 illustrates the circuit 100 during a read operation in an exemplary embodiment consistent with the principles of the present invention. A read enable (RE) line gating NFET 150 is set to $V_{RE}=1$. YR is connected to the column Y-line, which feeds into the inverting input of an op-amp integrator (not shown in this figure). A low read voltage $V_{read}$ is applied between XR and YR (the voltage being too low to significantly disturb the charge on the FTJ). In one embodiment, $V_{XR}=0.5$ and the non-inverting input to the op-amp integrator is set to voltage $0.5-V_{read}$. XR, YR, and NFET 150 form a read circuit feeding into the column Y line so the accumulated charge on the column FTJ's can be read in the op-amp current integrator. During a read operation, $V_{DD}$ is 1, $V_{XP}=1$, $V_{XN}=0$, and GND is at 0, so the output of analog inverter 110 is at 1, turning off PFET 130. The output of analog inverter 120 is at 0, turning off NFET 140. Thus, both pull up and pull down transistors are turned off, and the accumulated charge on the column FTJ's can be read in the op-amp current integrator.

Figure 4:
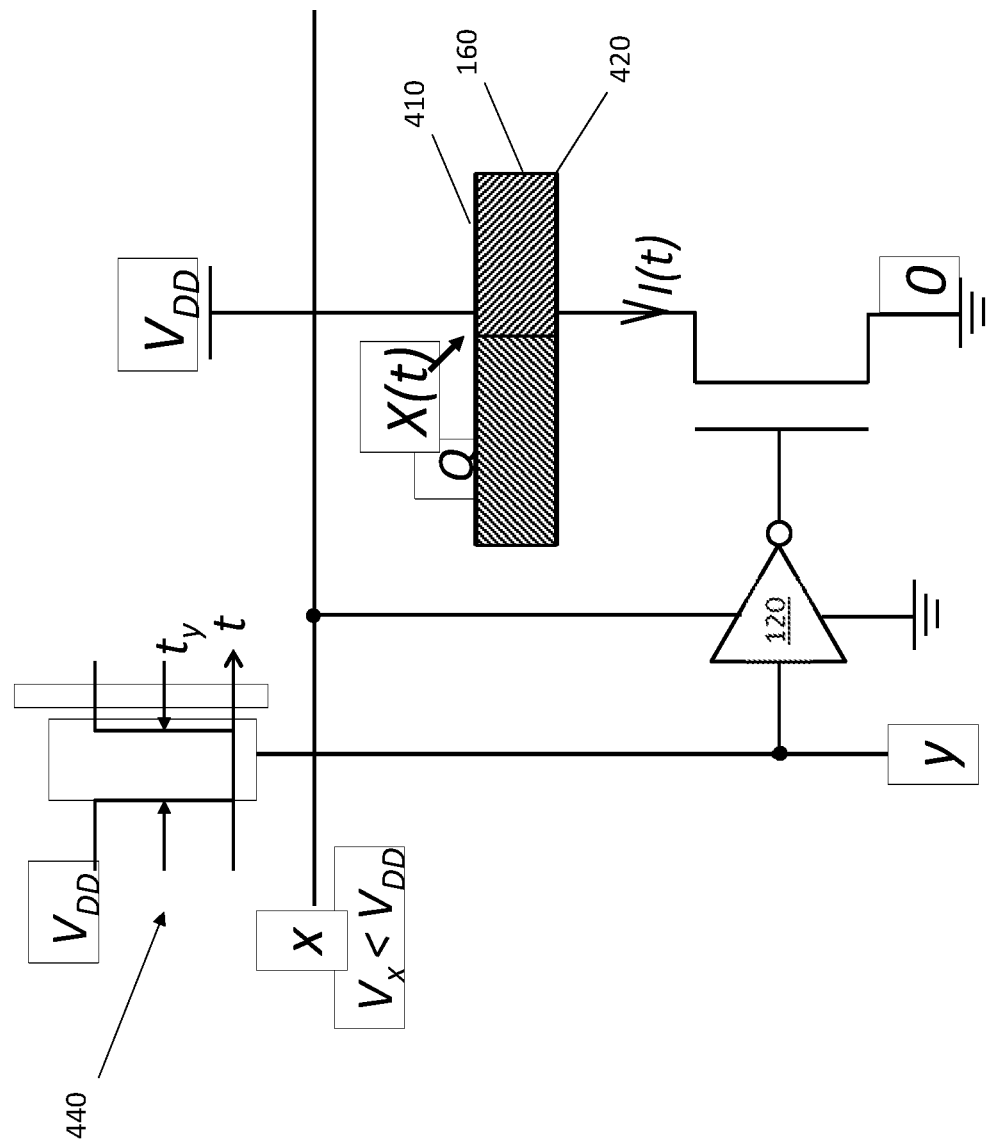
FIG. 4 illustrates a simplified circuit for updating FTJ 160, also known as an FE capacitor, for a single direction in an exemplary embodiment consistent with the principles of the present invention.

FIG. 4 illustrates a simplified circuit for updating FTJ 160, also known as an FE capacitor, for a single direction in an exemplary embodiment consistent with the principles of the present invention. A strip of FE, of width (into the paper) w and having a top electrode 410 and a bottom electrode 420, with a single DW transverse to the strip axis forms the dielectric in a FE capacitor or FTJ 160. The x-line carries a constant voltage $V_x$ during the write operation. As illustrated by the timing diagram 440 above the y-line, the y-line is at $V_{DD}$ when not writing, when transistor source-drain current is zero, but is grounded during a time interval $t_y$. During the $t_y$ window the FET gate (source is grounded) is at $V_x$, when its source-drain current I is approximately equal to FET transconductance $\gamma$ times $V_x$; $I=\gamma V_x$. If remnant FE polarization is $P_r$, the charge to move the DW by dX is $2P_r$ w dX. In time dt this equals the charge I dt. Hence the velocity $v_L = dX/dt = \gamma V_x/(2 P_r w)$. Thus the product $V_x t_y$ controls the DW displacement which defines the amplitude of the Hebbian update. The overall movement of the DW depends on the product of the voltage on the x-line and the length of pulse on the y-line.

Figure 5:
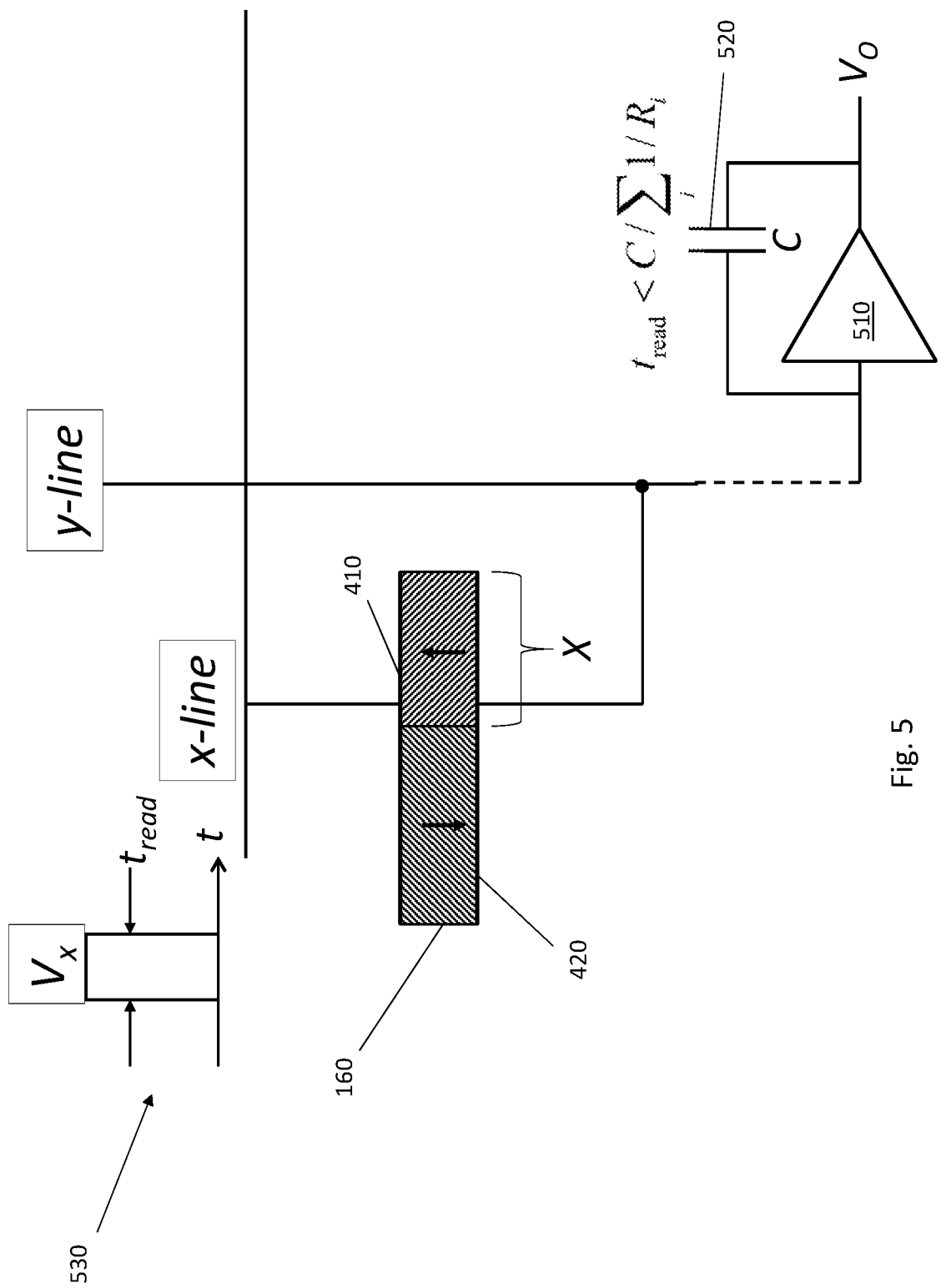
FIG. 5 illustrates a simplified circuit for a read of FTJ 160 in an exemplary embodiment consistent with the principles of the present invention.

FIG. 5 illustrates a simplified circuit for a read of FTJ 160 in an exemplary embodiment consistent with the principles of the present invention. The read is based on the concept of the Ferroelectric tunneling junction, wherein for a very thin FE (under 10 nm) current can be passed through the FE capacitor via the mechanisms of direct tunneling, Fowler-Nordheim tunneling, or thermionic emission. The current passed is strongly dependent on the direction of polarization. Direction of polarization is indicated by the arrows in FTJ 160. In one limit the current at a given voltage polarity is much larger for one polarization than for the other. In this situation, the current will be proportional to the area of the FE capacitor polarized in the favorable direction.

In this case the current is directly proportional to X, where X is the length of the favorably polarized section. As usual in RPU's, the input voltages $V_x$ on each x-line are applied, say as a pulse of length $t_{read}$ (shown in timing diagram 530), and the current is the sum of ($V_x$×conductance) over all devices in a column. The current can be read e.g. in an op-amp configured as an integrator 510, the time $t_{read}$ being less than the time constant C of capacitor 520 times the output impedance of the y-line being read. In the FTJ application the applied voltage $V_x$ needs to be relatively small in order not to disturb the polarization of the ferroelectric significantly.

Figure 6:
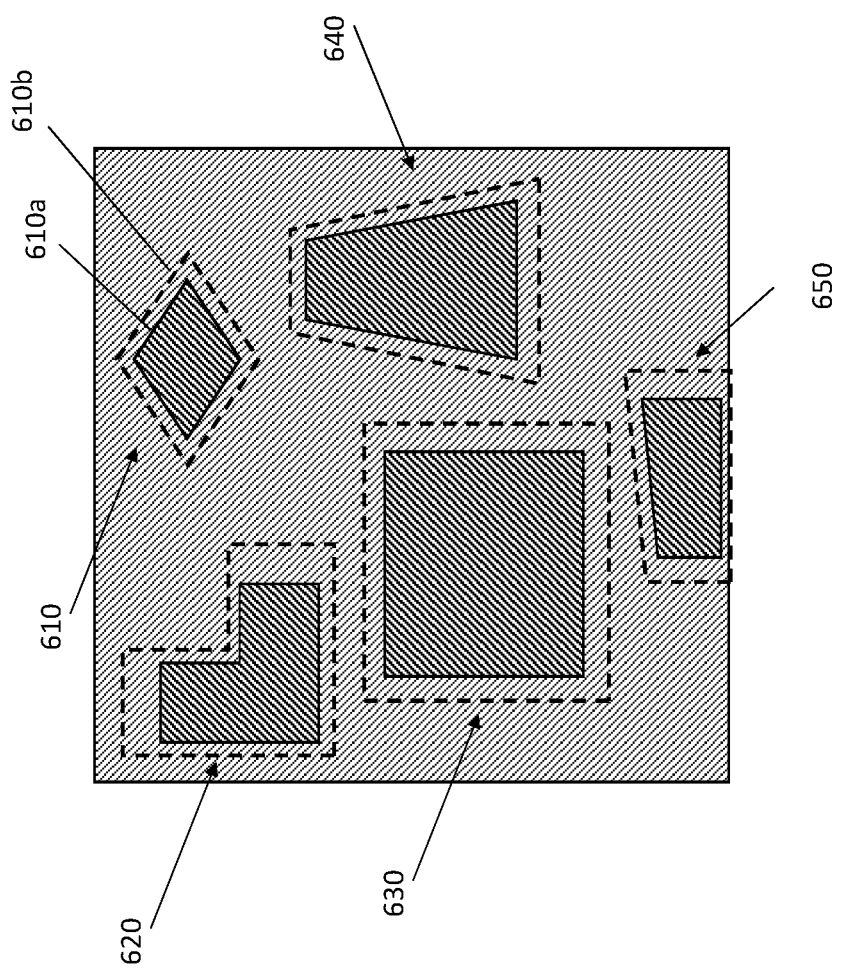
FIG. 6 illustrates a domain configuration generalized from one dimension ("1D") to two dimensions ("2D") in an exemplary embodiment consistent with the principles of the present invention.

FIG. 6 illustrates a domain configuration generalized from one dimension ("1D") to two dimensions ("2D") in an exemplary embodiment consistent with the principles of the present invention. The domain configuration can be generalized from 1D to 2D, with domains in the 2D capacitor being any shape 610, 620, 630, 640, 650 as illustrated in FIG. 6. Applying a specified current to such an FE capacitor, for example, containing a 2D arrangement of domains can expand the relative area of, say the closed domains in FIG. 6, e.g. 610a expanding to 610b, while the oppositely-polarized space between the domains in FIG. 6 contracts. Provided the new DW boundaries do not lead to a change in domain topography, it is expected that the expansion/contraction of the DW boundaries under a current will be approximately symmetric as in the 1D case.

Figure 7:
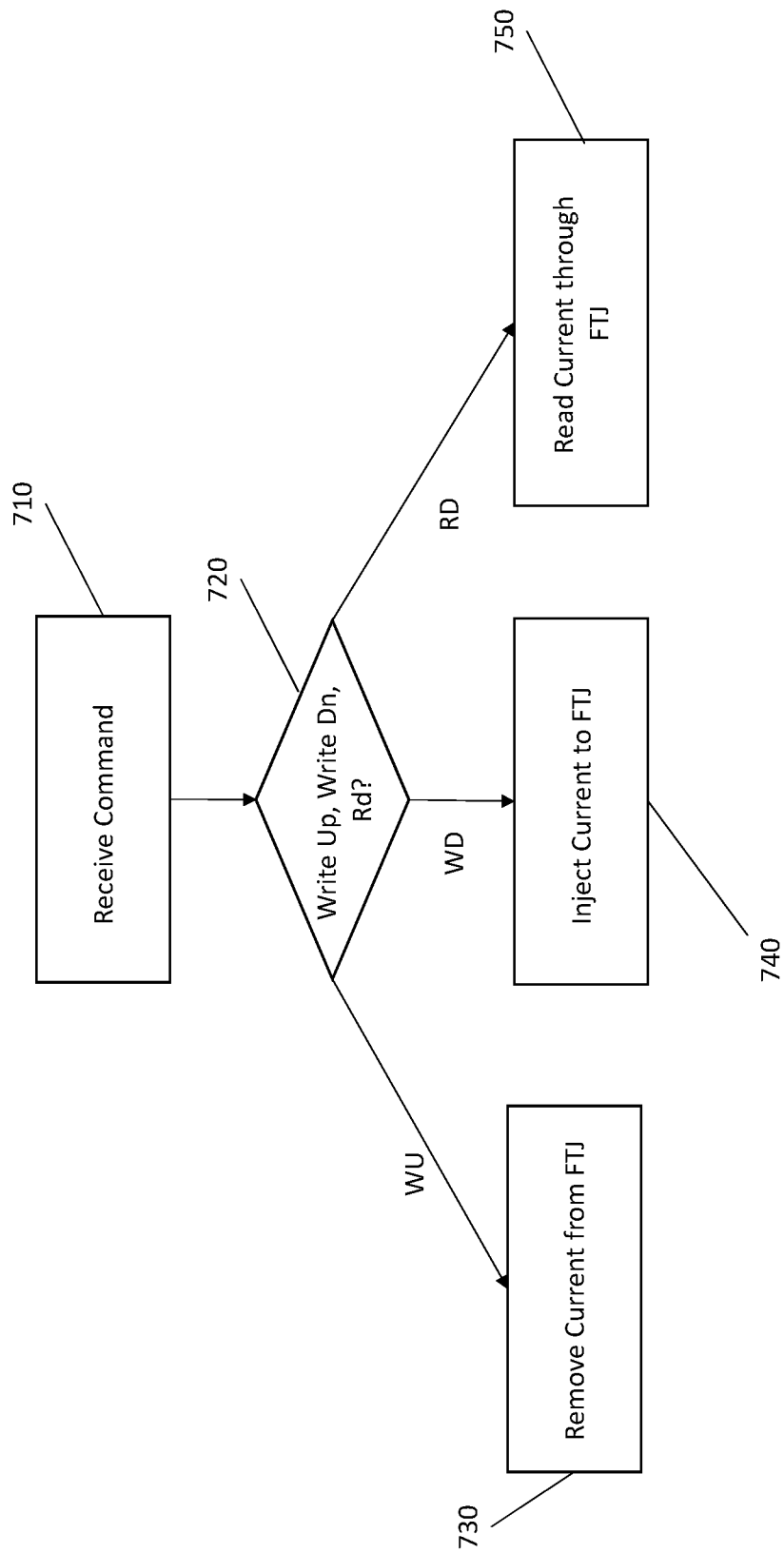
FIG. 7 illustrates a flow chart for using writing up, writing down, and reading a BJT in an exemplary embodiment consistent with the principles of the present invention.

FIG. 7 illustrates a flow chart for using writing up, writing down, and reading a FTJ in an exemplary embodiment consistent with the principles of the present invention. A command is received from a memory controller (stage 710). $V_{XR}=0.5$. A check is made as to whether the command is a Write Up command, a Write Down, command, or a Read Command (stage 720). A Write Up command can be determined based on a 1 to 0 transition on a write line, a 1 on an XP line, and a voltage $V_{XN}$ on the XN line. $V_{RE}=0$. A Write Down command can be determined based on a 0 to 1 transition on the write line, a voltage $V_{XP}$ on the XP line, and a 0 on the XN line. $V_{RE}=0$. A Read command can be determined based on a 1 on the XP line, a 0 on the XN line and $V_{RE}=1$.

If a Write Up command is received, current is removed from the FTJ (stage 730). Current can be removed by turning on a pull down transistor coupled to ground in series with the FTJ to remove at a substantially constant current over a period of time. If a Write Down command is received, current is added to the FTJ (stage 740) with a substantially constant current over a period of time. Current can be added by turning on a pull up transistor coupled to $V_{DD}$ in series with the FTJ. During a read operation, the current through the FTJ can be read by enabling RE and reading across XR and YR. The current can be read in an op-amp configured as an integrator following application of a relatively low read voltage which does not significantly disturb the ferroelectric polarization.

The circuit 100 is functionally equivalent to the classic concept of a synapse device with only two external terminals, because the memory controller correctly emits and interprets signals on the write up and write down X lines, the single write Y line, and the X and Y read lines. The circuit 100 can be accommodated in an array (e.g., a crossbar array) with, as explained, multiple X and Y lines, which is compatible with a variety of electronic circuits and devices, including ultra-high density non-volatile memory ("NVM") and artificial neural network (ANN) architectures. A basic array includes a set of multiple conductive row electrodes (XP, XN, XR) and a set of multiple conductive column electrodes (YW, YR) formed to intersect the set of conductive row electrodes. The intersections between the sets of electrode lines connect with the appropriate terminals on the circuit 100. This connectivity enables the state of the FTJ's 160 to be altered according to the Hebbian update rule, and the sum of the FTJ conductivities in a column to be measured, by using the circuit 100 (shown in FIGS. 1-3) and applying the necessary signals previously described herein between individual electrode lines of the multiple row and column electrode lines.

In neuromorphic computing applications (e.g., ANN), the FTJ 160, embedded in appropriate circuitry such as 100, can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of ReRAMs, which naturally expresses a fully-connected neural network.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments of the invention described herein.

What is claimed is:

1. A method of operating a ferroelectric tunneling ("FTJ"), the method comprising:

receiving, using a memory controller, a command;
   determining, using a memory controller, that the command is a write up command, a write down command, or a read command;
   based at least in part on the command being a write up command, removing, using a memory controller, charge from the FTJ with a substantially constant current removed over a period of time; and
   based at least in part on the command being a write down command, adding, using a memory controller, charge to the FTJ with a substantially constant current added over a period of time.

2. The method of claim 1, wherein removing charge from the FTJ comprises turning off a pull-up circuit and turning on a pull-down circuit.

3. The method of claim 1, wherein removing charge from the FTJ comprises turning on a pull-up circuit and turning off a pull-down circuit.

4. The method of claim 2, wherein turning off a pull-up circuit comprises receiving a one as an input to the pull-up circuit on a write line ("YW") and on a write up line ("XP") coupled to the pull-up circuit.

5. The method of claim 2, wherein turning on a pull-down circuit comprises receiving a one as an input to the pull-down circuit on a write line ("YW") and a voltage as an input on a write down line ("XN") coupled to the pull-down circuit.

6. The method of claim 3, wherein turning on a pull-up circuit comprises receiving a 0 as an input to the pull-up circuit on a write line ("YW") and a voltage as an input on a write up line ("XP") coupled to the pull-up circuit.

7. The method of claim 3, wherein turning off a pull-down circuit comprises receiving a 0 as an input to the pull-down circuit on a write line ("YW") and a zero to a write down line ("XN") as an input coupled to the pull-down circuit.

8. The method of claim 1, wherein, based at least in part on a determination that the command is a read command, turning off a pull-up circuit and turning off a pull-down circuit.

9. The method of claim 8, wherein the pull-up circuit is turned off by providing a 1 on a write up line ("XP") as an input to the pull-up circuit and a 0 on a write down line ("XN") as an input to the pull-down circuit.

10. The method of claim 1, wherein, based at least in part on a determination that the command is a read command, turning on an NFET in series with the FTJ and coupled to a read line ("XR").

11. The method of claim 10 further comprising reading a charge across the FTJ.

* * * * *